United States Patent [19]

Sato

[11] Patent Number: 5,144,310
[45] Date of Patent: Sep. 1, 1992

[54] A/D CONVERTER UTILIZING SUCCESSIVE APPROXIMATION

[75] Inventor: Fumiki Sato, Itami, Japan

[73] Assignee: Mitsubishi Denki Kabushiki Kaisha, Tokyo, Japan

[21] Appl. No.: 610,485

[22] Filed: Nov. 7, 1990

[30] Foreign Application Priority Data

Mar. 5, 1990 [JP] Japan .................................. 2-054009

[51] Int. Cl.$^5$ ............................................. H03M 1/38
[52] U.S. Cl. .................................... 341/161; 341/158
[58] Field of Search ................. 341/161, 155, 158, 159, 341/165, 160, 162

[56] References Cited

U.S. PATENT DOCUMENTS 4,293,848 10/1981 Cheng et al. ..................... 341/155
4,647,903 3/1987 Ryu .................................... 341/161

Primary Examiner—Todd E. Deboer
Assistant Examiner—B. K. Young
Attorney, Agent, or Firm—Townsend and Townsend

[57] ABSTRACT

The invention provides an A/D converter which comprises reference voltage generator means for generating a plurality of reference input voltages from a power supply, a comparator composed of switching means for inputting into the A/D converter an external analog input voltage and the reference input voltages and of an amplifier for amplifying the respective input voltages, and control means for controlling the reference voltage generator means and the comparator on the basis of an output from the comparator; the amplifier circuit of the comparator sharing its power supply with the reference voltage generator means.

4 Claims, 6 Drawing Sheets

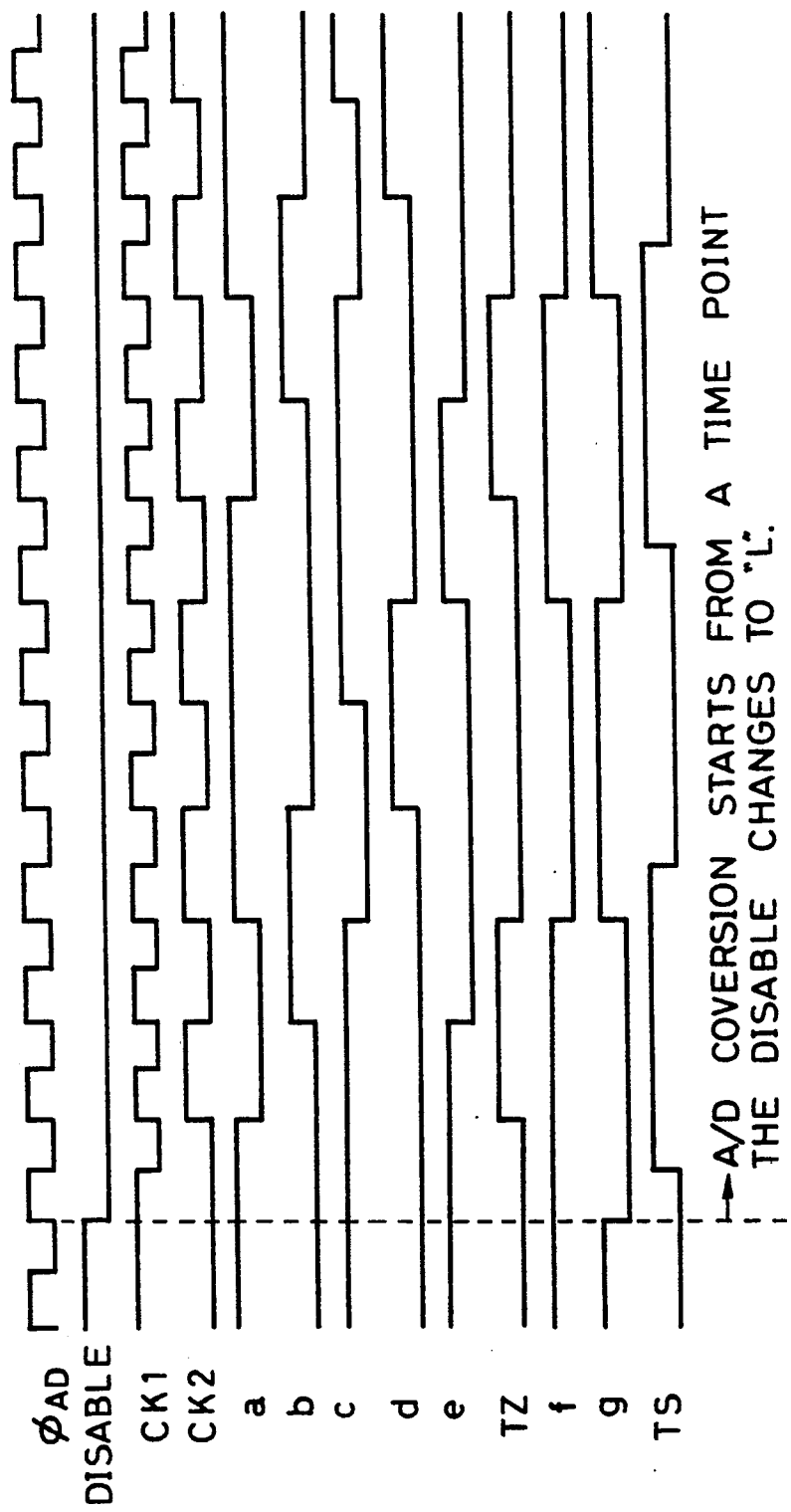

INTERNAL TRIGGER

STARTING POINT

EXTERNAL TRIGGER

STARTING POINT

A/D CONVERTER UTILIZING SUCCESSIVE APPROXIMATION

BACKGROUND OF THE INVENTION

1. Field of the Invention

The present invnetion relates to a successive comparison type A/D converter, and more specifically to an A/D converter including a reference voltage generator circuit, a comparator, and a control circuit for controlling the former circuits.

2. Description of the Prior Art

In prior practice, an A/D converter is included in a microcomputer, and is connected to a central processing unit (CPU), a DRAMC, and a DMAC through an address bus, a data bus, and a bus access controller, as illustrated in FIG. 5. The A/D converter is further connected to a RAM, timers, and an external port P6, etc., through the address bus and the data bus, for converting analog signals from external apparatuses to digital signals and outputting the converted digital signals to the CPU and the like.

The A/D converter comprises a reference voltage generator circuit for generating a reference input voltage from a reference power supply $V_{REF}$, a charge balancing comparator including an amplifier circuit and driven by switching means and an A/D conversion power supply $AV_{CC}$, and a control circuit for controlling the above circuits. In the A/D converter, the reference input voltage from the reference voltage generator circuit is altered by the control circuit and inputted into the charge balancing comparator alternately with an analog input voltage for successive comparison with the latter, and there is estimated a changing point of an output voltage from the comparator with respect to the analog input voltage for converting the analog signal to a digital signal (A/D conversion).

With the prior A/D converter constructed as described above, a difference is produced between fine changes in the voltage of the reference power supply $V_{REF}$ and the voltage of the A/D conversion power supply $AV_{CC}$ in the neighborhood of the time the input into the charge balancing comparator is switched from the analog input voltage to the reference input voltage. Accordingly, there is produced a difference, as an error as a result of the A/D conversion, between a shift of the A/D conversion from a correct one due to the fine change in the reference power supply of the reference voltage generator circuit and that due to the fine change in the A/D conversion power supply for an amplifier circuit of the charge balancing comparator. Hereby, accuracy of the A/D conversion is lowered.

SUMMARY OF THE INVENTION

In view of the drawbacks with the prior art, it is an object of the present invention to provide an A/D converter capable of reducing the lowering of the accuracy of A/D conversion.

An A/D converter according to the present invention comprises reference voltage generator means for generating a plurality of reference input voltages from a power supply, a comparator composed of switching means for alternately inputting external analog input voltage and said reference input voltage into said A/D converter and of an amplifier for amplifying said respective input voltages, and control means for controlling said reference voltage generator means and said comparator based upon an output from said comparator, said amplifier circuit of said comparator and said reference voltage generator means sharing a power supply.

The above and other objects, features, and advantages of the invention will become more apparent from the following description when taken in conjunction with the accompanying drawings.

BRIEF DESCRIPTION OF THE DRAWINGS

FIGS. 4A–4C are timing diagrams.

DESCRIPTION OF THE PREFERRED EMBODIMENT

In what follows, an A/D converter, an embodiment of the present invention will be described with reference to FIGS. 1 to 4.

As illustrated in the figures, the numeral 1 is a reference voltage generator circuit, 2 is a charge balancing comparator, 3 and 4, and 5 are input terminals and an output terminal of the charge balancing comparator 2, 6 is a control circuit for controlling the reference voltage generator circuit 1 and the charge balancing comparator 2, 8 is an amplifier, 12 is switching means composed of electric switches 12a, 12b, 14 is an electric switch, and 15, 16 are capacitors each serving as capacitances.

Figure 2:
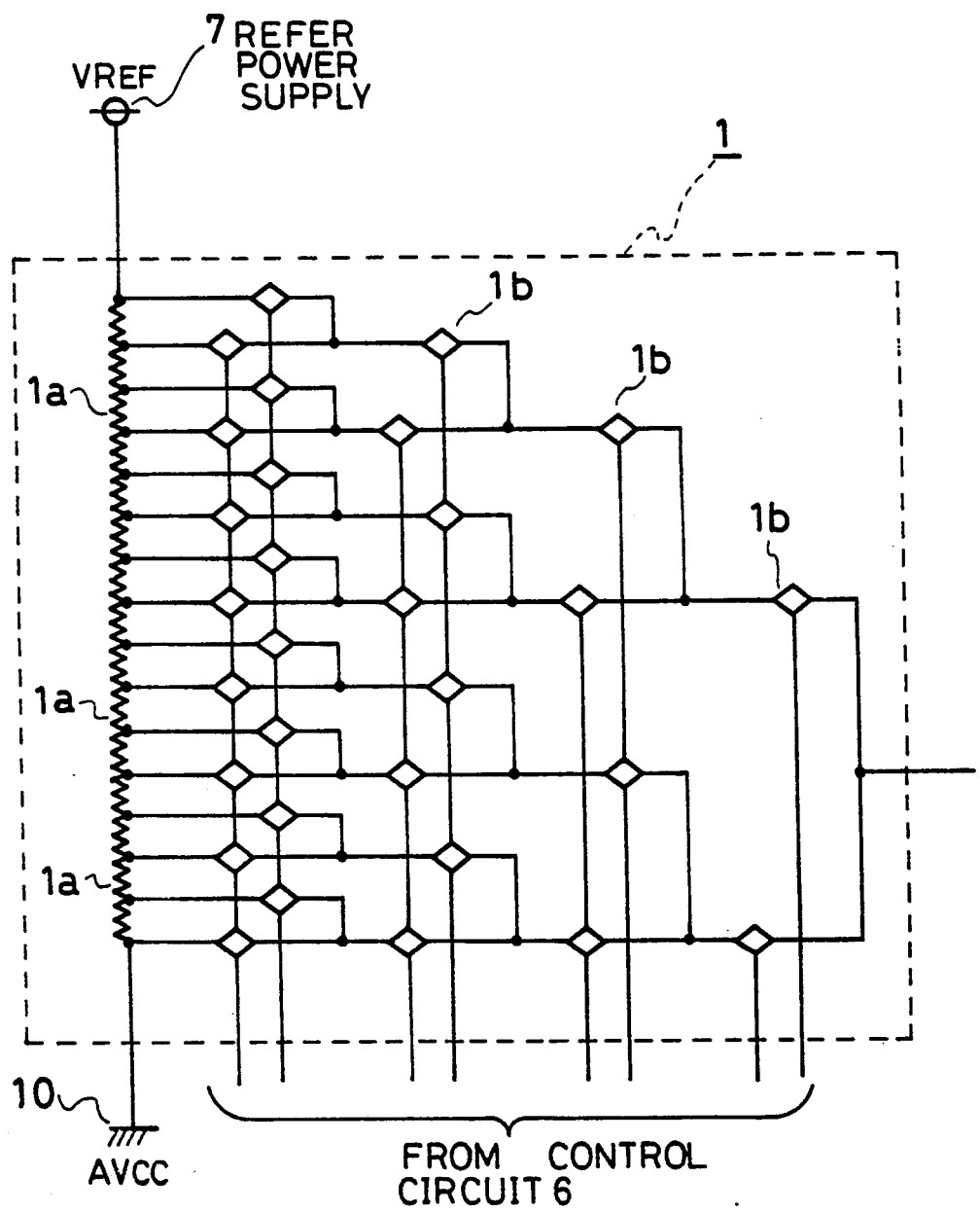
FIGS. 2 and 3 are circuit diagrams of a reference voltage generator circuit and a control circuit in the A/D converter of the present embodiment.

The reference voltage generator circuit 1 includes as illustrated in FIG. 2 a plurality of resistors 1a connected in series to the reference power supply 7 which serve to divide the reference input voltage for predetermined resolution and a plurality of electric switches 1b each connected between the adjacent resistors 1a for taking out the divided voltages across the resistors 1a. The electric switches 1b are switched on respectively on the basis of values set to registers (not shown) of the control circuit 6, and the reference input voltage divided by the resistors 1a is taken out through the electric switch 1b so switched on.

Figure 3:
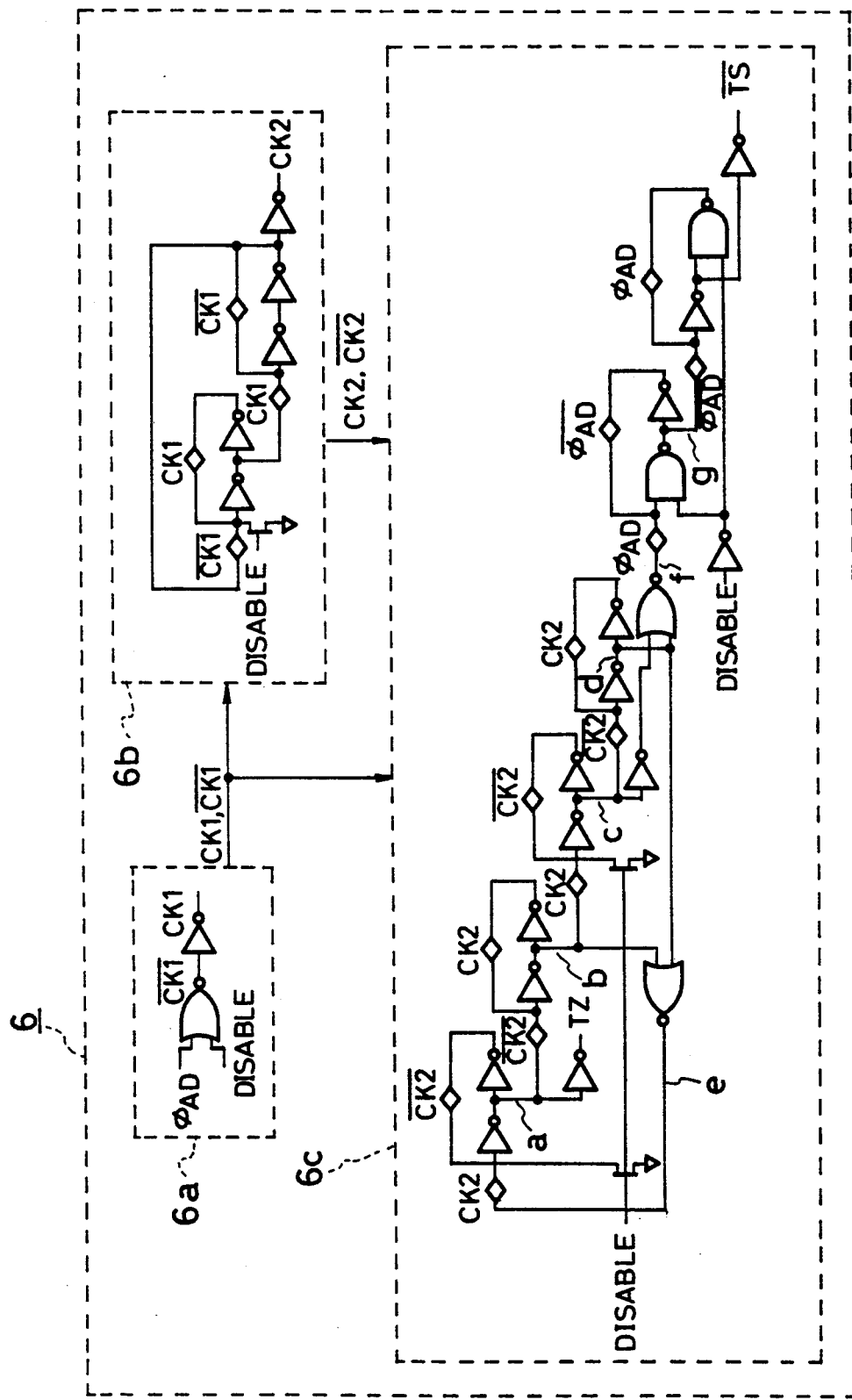
Figure 4B:
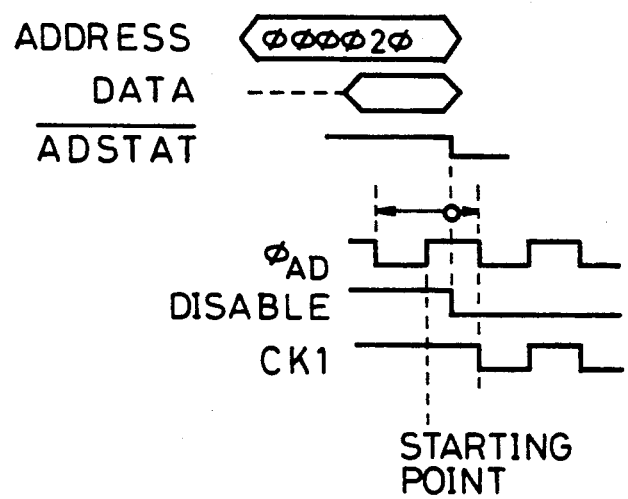
Figure 4C:
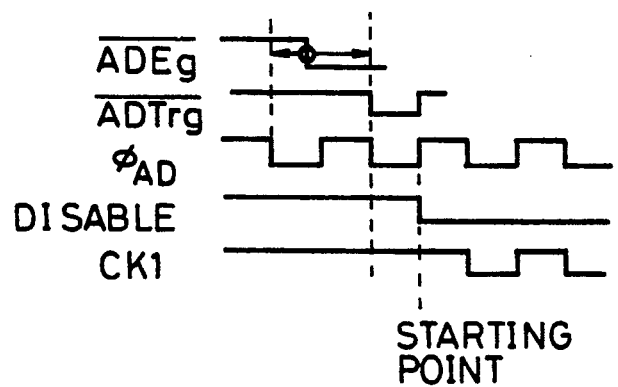
Figure 5:
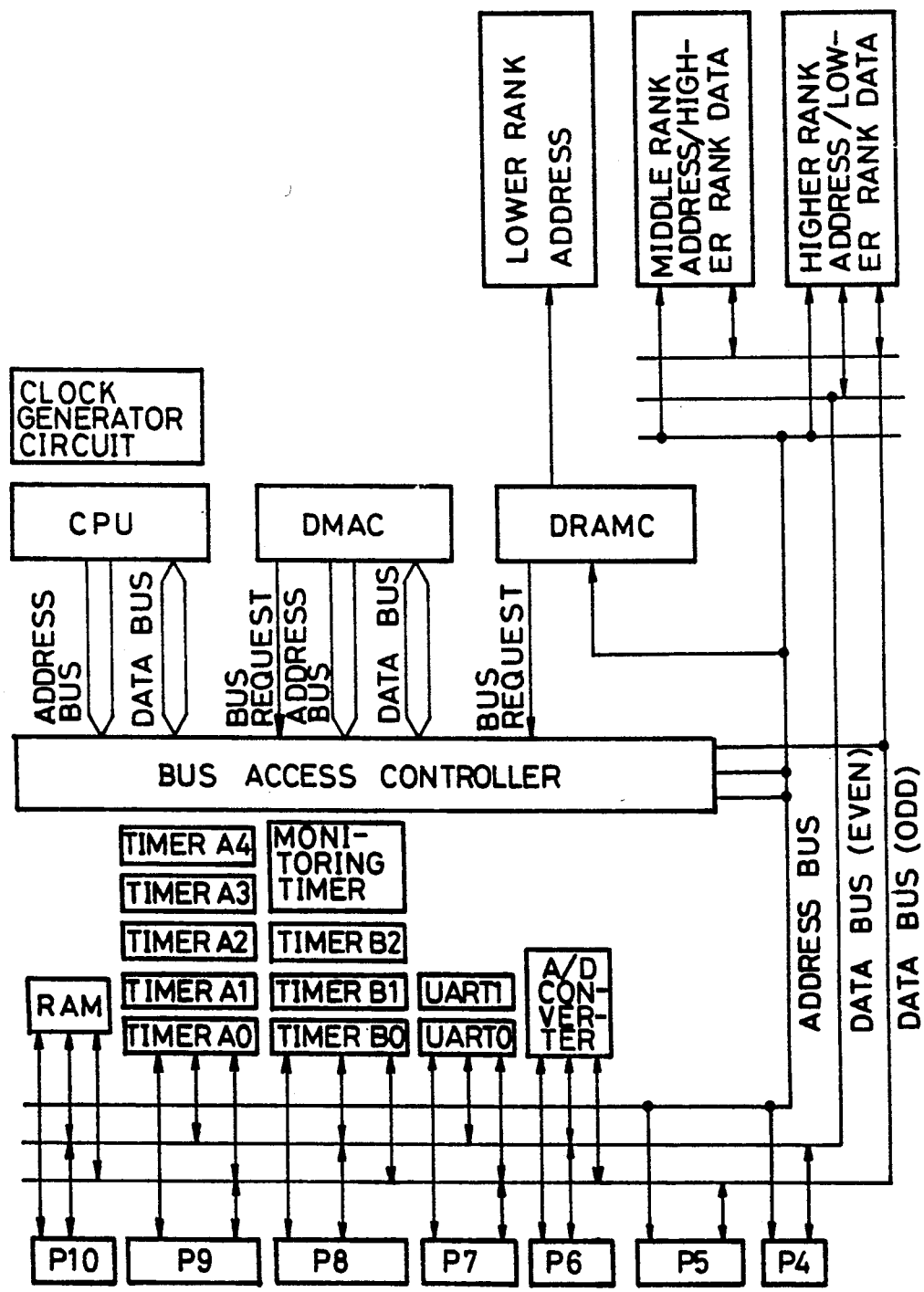
FIG. 5 is a block diagram of a microcomputer including a prior A/D converter.

The switching means 12 is switched on the basis of a timing chart illustrated in FIG. 4A. The timing signal is supplied from the control circuit 6 which includes as illustrated in FIG. 3 first generator means 6a for generating a first timing signal CK1 of the control circuit 6 based upon a reference clock $\phi_{AD}$, second generator means 6b for generating a second timing signal CK2 based upon the first timing signal CK1, and third generator means 6C for generating switching signals TS, TZ for switching the electric switches 12a, 12b, 14 based upon the reference clock $\phi_{AD}$ and the first and second timing signals CK1, CK2. These signals described above are generated on the basis of an ADSTAT signal yielded on the basis of address and data outputs of an internal trigger illustrated in FIG. 4B or of ADEg and ADTrg signals of an external trigger illustrated in FIG. 4C taking as a starting point the time and A/D conversion start signal DISABLE becomes "L".

Figure 1:
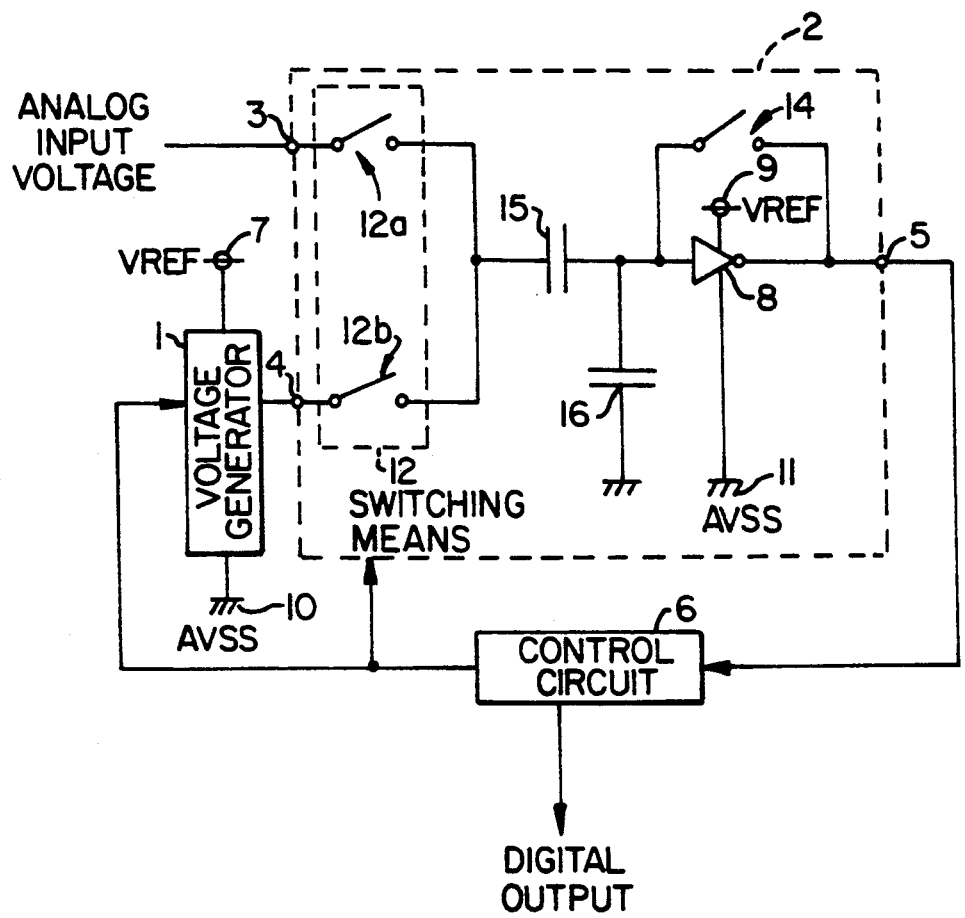
FIG. 1 is a block diagram of an A/D converter, an embodiment of the present invention.

Operation of the A/D conversion in the A/D converter constructed as above is as follows. As illustrated in FIG. 1, the analog input voltage and the reference input voltage generated by the reference voltage generator circuit 1 are applied to the input terminals 3, 4 of the charge balancing comparator 2. The output terminal 5 of the charge balancing comparator 2 is connected to the input side of the control circuit 6, a control signal from which is applied to the reference voltage generator circuit 1 and the charge balancing comparator 2. The external reference voltage $V_{REF}$ is applied to the power supply 7 of the reference voltage generator ciructit 1 and further to the power supply 9 of the amplifier circuit 8 of the charge balancing comparator 2. Further, A/D conversion ground voltage $AV_{SS}$ is applied to the ground 10 of the reference voltage generator circuit 1 and to the ground 11 of the amplifier circuit 8.

For the A/D conversion, reference input voltage A. $V_{REF}$ (herein, A=n/m, m; a constant indicating the resolution of the A/D conversion, n; an integer not exceeding m−1.) generated by the reference voltage generator circuit 1 is changed by the control circuit 6 and inputted into the charge balancing comparator 2 alternately with the analog input voltage, on the basis of an output level from which comparator 2 the control circuit 6 successively estimates a changing point of the output with respect to the analog input voltage.

The coefficient A of the reference input voltage at the aforementioned changing point as the external reference voltage $V_{REF}$ is changed by $\Delta V$ upon the switching by the switching means 12 is given by:

$$\frac{V_{AN}}{V_{REF}}\left(1 + \alpha \frac{\Delta V}{V_{AN}} - \frac{\Delta V}{V_{REF}}\right),$$

where the analog input voltage is assumed $V_{AN}$ and $\alpha$ is a constant that changes depending upon how the reference input voltage is generated. The second term corresponds to a change in the supply voltage to the charge balancing comparator 2, and the third term corresponds to a change in the supply voltage of the reference voltage generator circuit 1. Signs of both terms are always different and compensated for a difference therebetween to reduce any error of the A/D conversion which might be caused by the fluctuations of the supply voltage (external reference voltage $V_{REF}$).

Although in the present embodiment the A/D converter was constructed with a set of the circuit comprising the reference voltage generator circuit 1 and the charge balancing comparator 2, it may be constructed with a plurality of sets of the circuits comprising the reference voltage generator circuits 1 and the charge balancing comparators 2. Additionally, a plurality of stages of the amplifier circuits 8 may be provided in the charge balancing comparator 2 provided the first stage amplifier circuit 8 shares its power supply with the reference voltage generator circuit 1.

According to the present invention, as described above, the reference voltage generator means shares its power supply with the amplifier circuit of the comparator and hence fine changes are compesnsated between the voltages of the reference power supply $V_{REF}$ and of the A/D conversion power supply $AV_{CC}$ in the neighborhood of the time the inputting into the comparator is switched from the analog input voltage to the reference input voltage. Therefore, there is eliminated any difference between shifts of the A/D conversion from a correct result of the conversion due to a fine variation of the reference power supply of the reference voltage generator means and due to a fine variation of the A/D conversion power supply of the amplifier circuit of the comparator. Thus, any error of the result of the A/D conversion can be reduced and hence lowering of the accuracy of the A/D conversion can be reduced.

What is claimed is:
1. An analog-to-digital converter comprising:
   voltage generating means comprising a reference voltage input, a voltage output and at least one control input signal for selectively generating voltages at the voltage output derived from the reference voltage input in response to the state of voltages applied to the control input signal;
   comparator means comprising first and second inputs, a comparator voltage supply input and an output for outputting a first voltage level when the first comparator input voltage is greater than the second comparator input voltage and for outputting a second voltage level when the second comparator input voltage is greater than the first comparator input voltage, where the second comparator input is coupled to the voltage output of the voltage generating means and where the first comparator input is coupled to an analog signal to be converted;
   control means comprising an input and at least one output for applying voltage states to the control input signal in response to the output of the comparator means, where the control means input is coupled to the output of the comparator means, where the outputs of the control means are coupled to the control input signals of the voltage generating means and where the outputs of the control means are the digital output of the analog-to-digital converter; and
   a common supply voltage directly connected both to the reference voltage input of the voltage generating means and to the comparator voltage supply input.

2. The apparatus of claim 1, the voltage generating means further comprising at least one resistor in series connected between the reference voltage input and ground, where the voltages selectively applied to the voltage output in response to the state of voltages at the control input signals are obtained from a connection point of the resistor.

3. The apparatus of claim 2, the comparator means further comprising an amplifier having an input, an output and a supply voltage input, where the amplifier provides the amplified and inverted input signal at its output;
   first switching means connected between the first and second inputs of the comparator means and having an output for selectively applying one of the first and second inputs to the output of the first switching means;
   a first capacitor coupled between the amplifier input and ground;
   a second capacitor coupled between the amplifier input and the output of the first switching means; and
   second switching means coupled between the input and output of the amplifier, where the output of the amplifier is coupled to the output of the comparator means and where the comparator voltage supply input is coupled to the amplifier supply input.

4. The apparatus of claim 3, where the first and second switching means are responsive to first and second timing control signals, respectively, the apparatus further comprising:
   first generating means for generating the first timing control signal; and
   second generating means for generating the second timing control signal.

* * * * *